United States Patent
Hsu et al.

(10) Patent No.: US 9,252,155 B2
(45) Date of Patent: Feb. 2, 2016

(54) MEMORY DEVICE AND METHOD FOR MANUFACTURING THE SAME

(71) Applicant: Macronix International Co., Ltd., Hsinchu (TW)

(72) Inventors: Tzu-Hsuan Hsu, Chiayi County (TW); Wei-Chen Chen, Taoyuan County (TW); Hang-Ting Lue, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/309,923

(22) Filed: Jun. 20, 2014

(65) Prior Publication Data

US 2015/0372001 A1    Dec. 24, 2015

(51) Int. Cl.
| | | |
|---|---|---|
| *H01L 23/52* | (2006.01) | |
| *H01L 27/115* | (2006.01) | |
| *H01L 23/532* | (2006.01) | |
| *H01L 23/528* | (2006.01) | |
| *H01L 21/768* | (2006.01) | |
| *H01L 21/225* | (2006.01) | |
| *H01L 21/285* | (2006.01) | |

(52) U.S. Cl.
CPC ........ *H01L 27/11582* (2013.01); *H01L 21/225* (2013.01); *H01L 21/28525* (2013.01); *H01L 21/768* (2013.01); *H01L 23/528* (2013.01); *H01L 23/53271* (2013.01)

(58) Field of Classification Search
CPC .............. H01L 21/28052; H01L 21/823842; H01L 29/4941; H01L 23/528; H01L 27/0207; H01L 23/522

USPC ........... 257/211, 296, 66, 288, 324; 438/585, 438/591, 254

See application file for complete search history.

(56) References Cited

U.S. PATENT DOCUMENTS

| | | | | | |
|---|---|---|---|---|---|
| 6,163,043 | A | * | 12/2000 | Hirano .............. | H01L 27/11502 257/296 |
| 2001/0026482 | A1 | * | 10/2001 | Sakai ...................... | C23C 16/24 365/200 |
| 2002/0160593 | A1 | * | 10/2002 | Dokumaci ........ | H01L 21/26506 438/585 |
| 2008/0042192 | A1 | * | 2/2008 | Park .................... | H01L 29/7923 257/324 |
| 2009/0065779 | A1 | * | 3/2009 | Kusumoto ........ | H01L 21/28052 257/66 |
| 2010/0102292 | A1 | * | 4/2010 | Hiura ..................... | B82Y 10/00 257/9 |
| 2011/0254074 | A1 | * | 10/2011 | Anezaki ............ | H01L 21/28273 257/321 |
| 2011/0309429 | A1 | * | 12/2011 | Kiyotoshi ............ | B82Y 30/00 257/321 |
| 2014/0239358 | A1 | * | 8/2014 | Shah ................. | H01L 29/42384 257/288 |

* cited by examiner

*Primary Examiner* — Mohammed Shamsuzzaman
(74) *Attorney, Agent, or Firm* — McClure, Qualey & Rodack, LLP

(57) ABSTRACT

A semiconductor structure and a method for manufacturing the same are disclosed. The semiconductor structure includes a first electrode layer, a second electrode layer and a dielectric layer between the first electrode layer and the second electrode layer. A width of the second electrode layer becomes larger in a direction away from the dielectric layer.

10 Claims, 7 Drawing Sheets

MEMORY DEVICE AND METHOD FOR MANUFACTURING THE SAME

BACKGROUND

1. Technical Field

The invention relates to a semiconductor structure and a method for manufacturing the same are disclosed and more specifically to a memory device and a method for manufacturing the same.

2. Description of the Related Art

Semiconductor structures include memory devices, used in storage elements for many products such as MP3 players, digital cameras, computer files, etc. As the application increases, the demand for the memory device focuses on small size and large memory capacity. For satisfying the requirement, a memory having a high element density is need.

Designers have developed a method for improving a memory device density, using 3D stack memory device so as to increase a memory capacity and a cost per cell. However, it is easy to degrade a memory window due to a poor electric field distribution during erasing and programming a memory.

SUMMARY

According to one embodiment, a semiconductor structure is disclosed. The semiconductor structure comprises a first electrode layer, a second electrode layer and a dielectric layer between the first electrode layer and the second electrode layer. A width of the second electrode layer becomes larger in a direction away from the dielectric layer.

According to another embodiment, a semiconductor structure is disclosed. The semiconductor structure comprises a first electrode layer, a second electrode layer and a dielectric layer between the first electrode layer and the second electrode layer. A dopant concentration of the second electrode layer becomes lower in a direction toward the dielectric layer.

According to yet another embodiment, a manufacturing method for a semiconductor structure. The method comprises following steps. A first electrode layer is formed. A dielectric layer is formed on the first electrode layer. A first electrode material is formed on the dielectric layer. A second electrode material is formed on the first electrode material. A thermal step is performed to diffuse a dopant from the second electrode material into the first electrode material. An etching step is performed to remove portions of the first electrode material and the second electrode material simultaneously. The etching step etches the first electrode material by an etching rate faster than an etching rate to the second electrode material. Remained portions of the first electrode material and the second electrode material by the etching step form a second electrode layer.

DETAILED DESCRIPTION

Figure 1A:
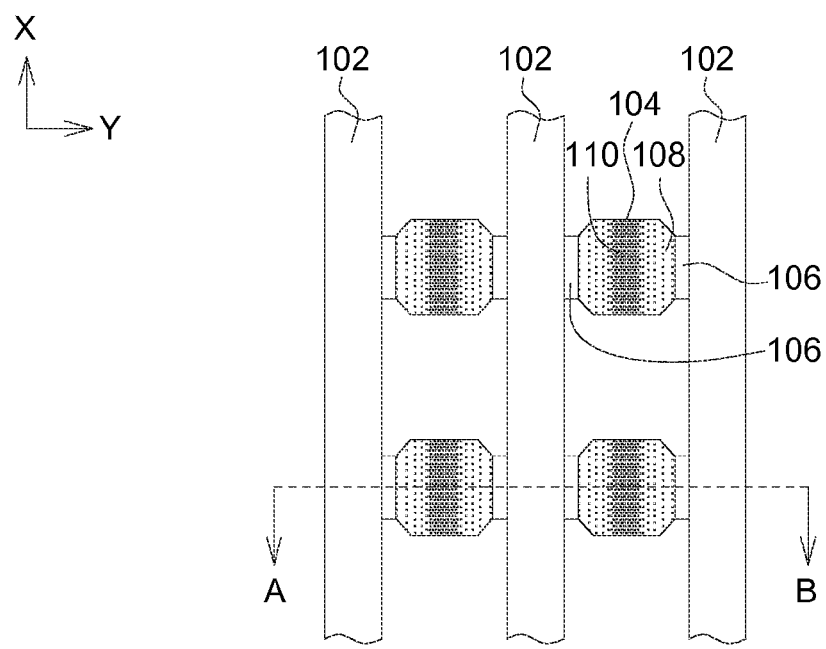
FIG. 1A illustrates a plan view of a semiconductor structure according to one embodiment.
Figure 1B:
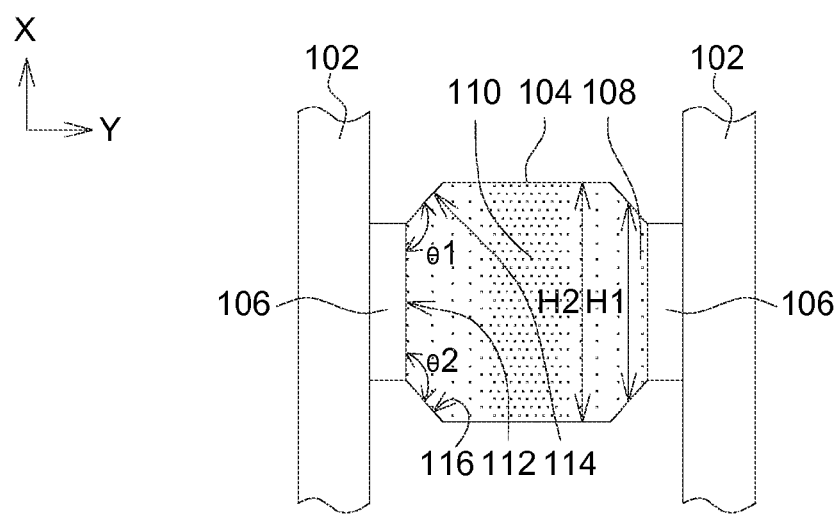
FIG. 1B illustrates an enlarged view of a portion of a semiconductor structure.

FIG. 1A illustrates a plan view of a semiconductor structure according to one embodiment. FIG. 1B illustrates an enlarged view of a portion of the semiconductor structure shown in FIG. 1A. The semiconductor structure comprises a first electrode layer 102, a second electrode layer 104, and a dielectric layer 106 between the first electrode layer 102 and the second electrode layer 104. The first electrode layer 102 and the second electrode layer 104 may comprise polysilicon, a metal, or other suitable conductive materials. The dielectric layer 106 may comprise an oxide, a nitride, such as silicon oxide, silicon nitride or silicon oxynitride, or other suitable dielectric materials, such as high-k materials. The dielectric layer 106 is not limited to a single-layer structure, and may use multi-layer dielectric structure properly, such as an ONO structure. For example, a charge-trapping material may use a high-k material having discrete trapping nano-crystal.

In embodiments, a width (in X direction) of the second electrode layer 104 becomes larger in a direction away from the dielectric layer 106. This profile design can result in a better electric field distribution during operating the memory device, in other words, a portion of the dielectric layer 106 adjacent to the second electrode layer 104 (word line) has a lower (decreased) electric field, and a portion of the dielectric layer 106 adjacent to the first electrode layer 102 (channel bit line) has a higher (increased) electric field. Therefore, the memory has a larger memory window due to an improving carrier injecting and trapping into the trapping layer during erasing and programming processes and inhibiting gate injection resulted from the profile design of the second electrode layer 104. For example, the second electrode layer 104 may comprise a first electrode portion 108 and a second electrode portion 110 adjoined to each other. A width H1 (FIG. 1B) of the first electrode portion 108 adjoined to the dielectric layer 106 becomes larger in a direction away form the dielectric layer 106. The first electrode portion 108 of the second electrode layer 104 has a first sidewall 112 (FIG. 1B) adjoined with the dielectric layer 106, and flat second sidewall 114 and flat sidewall 116 adjoined to opposing ends of the first sidewall 112. The flat second sidewall 114 and the flat sidewall 116 are separated from the dielectric layer 106. An included angle θ1 between the first sidewall 112 and the second sidewall 114 is bigger than 90 degrees. An included angle θ2 between the first sidewall 112 and the sidewall 116 is bigger than 90 degrees. In one embodiment, the second electrode portion 110 has a constant width H2. The second electrode layer 104 is not limited to an octagon shown in figure, and may be designed to have other suitable shapes.

In one embodiment, the first electrode portion 108 and the second electrode portion 110 of the second electrode layer 104 may have different material characteristics. For example, a dopant concentration of the first electrode portion 108 is lower than a dopant concentration of the second electrode portion 110. The dopant concentration of the first electrode portion 108 becomes lower in a direction toward the dielectric layer 106. The second electrode portion 110 has a substantial uniform dopant concentration. In one embodiment, the first electrode portion 108 and the second electrode portion 110 are a polysilicon, and the dopant is a P-type impurity, but not limited thereto.

Figure 2:
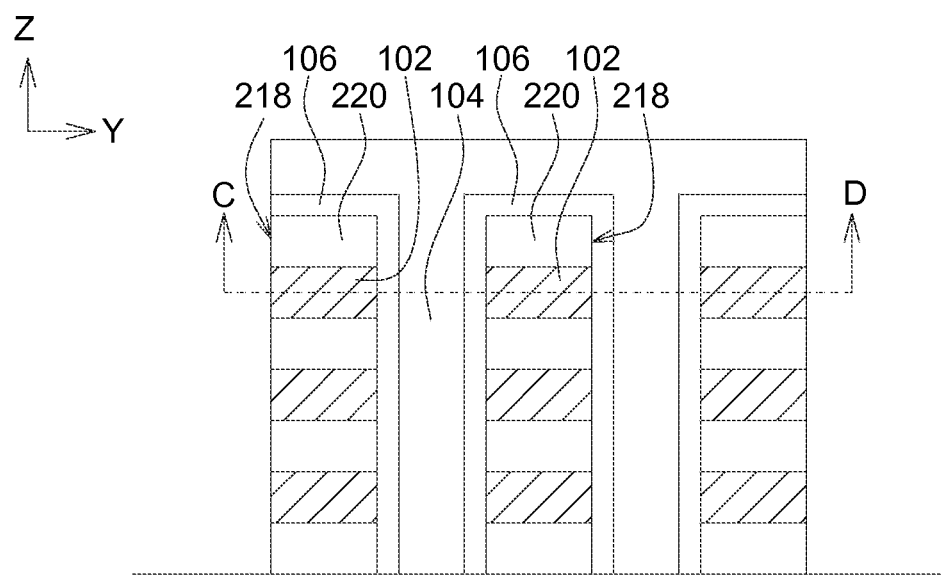
FIG. 2 illustrates a cross-section view of a semiconductor structure according to one embodiment.

FIG. 2 illustrates a cross-section view of the semiconductor structure according to one embodiment. In one embodiment, FIG. 2 is drawn along AB line in FIG. 1A, and FIG. 1A is drawn along CD line in FIG. 2. In one embodiment, as shown in FIG. 1A and FIG. 2, the semiconductor structure is a 3D stacked memory device comprising a plurality of stack structures 218. Each of the stack structures 218 (FIG. 2) comprises a plurality of dielectric strips 220, a plurality of the first electrode layers 102 used as conductive strips stacked alternately and a dielectric layer 106 covering there on. The dielectric layer 106 is a continuous dielectric layer conformally covering on two opposing sidewalls and a top surface of the stack structure 218 that is constituted by the dielectric strips 220 and the first electrode layer 102, thus the dielectric layer 106 is disposed on opposing sidewalls of the first electrode layers 102 (or the stack structure 218). The second electrode layer 104 is disposed between the stack structures 218 and on opposing sides of the first electrode layers 102 disposed in two adjacent stack structures 218.

Figure 3:
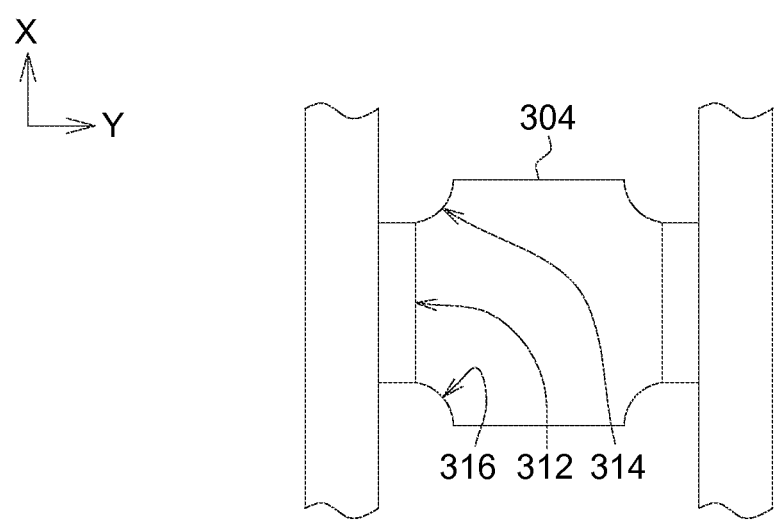
FIG. 3 illustrates a plan view of a semiconductor structure according to one embodiment.

FIG. 3 illustrates a plan view of the semiconductor structure according to another embodiment, which is different from the semiconductor structure shown in FIG. 1B in that the second sidewall 314 and the sidewall 316 adjoined to the first sidewall 312 of the second electrode layer 304 are concave sidewalls.

Figure 4:
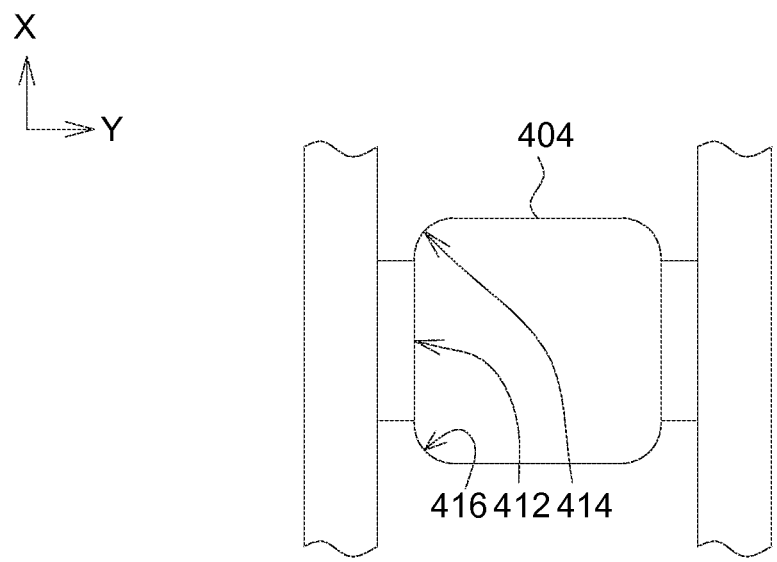
FIG. 4 illustrates a plan view of a semiconductor structure according to one embodiment.

FIG. 4 illustrates a plan view of the semiconductor structure according to yet another embodiment, which is different from the semiconductor structure shown in FIG. 1B in that the second sidewall 414 and the sidewall 416 adjoined to the first sidewall 412 of the second electrode layer 404 are convex sidewalls.

Figure 5A:
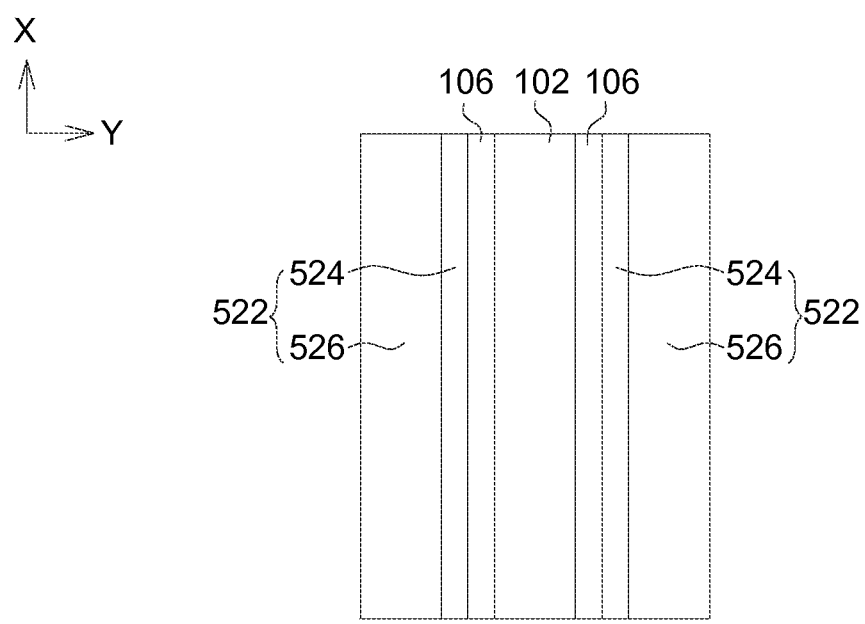
FIG. 5A to FIG. 5C illustrate a manufacturing process for a semiconductor structure according to one embodiment.
Figure 5B:
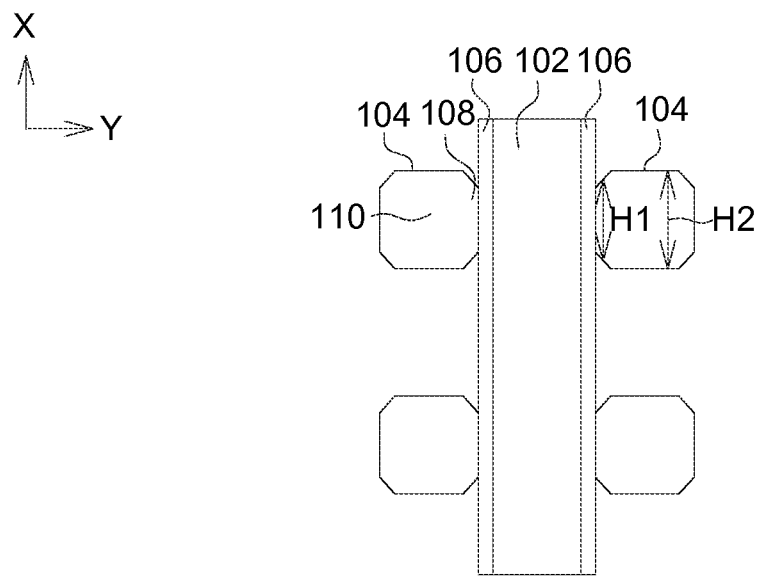
Figure 5C:
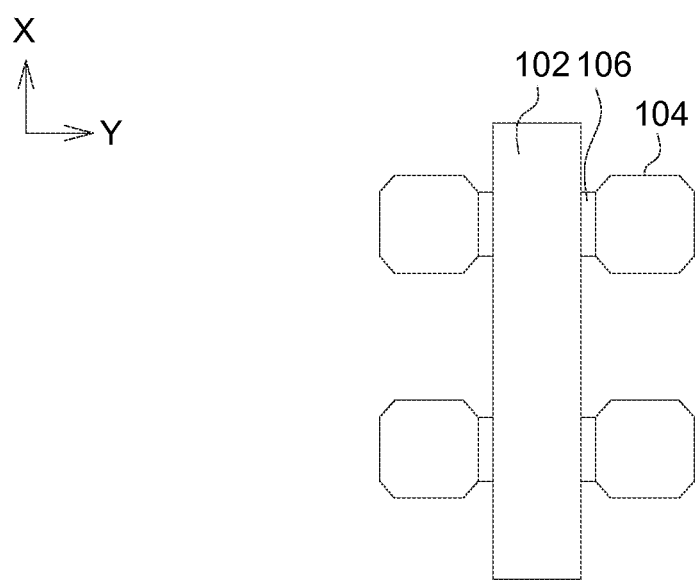

FIG. 5A to FIG. 5C illustrate a manufacturing process for the semiconductor structure according to one embodiment.

Referring to FIG. 5A, the First electrode layer 102 is formed. The dielectric layer 106 is formed on the first electrode layer 102. An electrode material 522 is formed on the dielectric layer 106. In one embodiment, the electrode material 522 may comprise a first electrode material 524 formed on the dielectric layer 106, and a second electrode material 526 formed on the first electrode material 524. In one embodiment, the first electrode material 524 is an un-doped polysilicon, and the second electrode material 526 is a doped polysilicon, for example, doped with a P-type impurity. A dopant of the second electrode material 526 is diffused into the first electrode material 524 by a thermal step. In addition, a concentration of the dopant diffused into the first electrode material 524 is controlled to become lower in the direction toward the dielectric layer 106.

Referring to FIG. 5B, portions of the first electrode material 524 and the second electrode material 526 are removed at the same time by an etching step which leave the second electrode layer 104 formed by the remained portions of the first electrode material 524 and the second electrode material 526. In one embodiment, the etching method etches the first electrode material 524 (FIG. 5A) having the lower dopant concentration with an etching rate faster than an etching rate to the second electrode material 526 having the higher dopant concentration. Therefore, the remained portion of the first electrode material 524 having the impurity concentration becoming lower in the direction toward the dielectric layer 106 forms the first electrode portion 108 having the width H1 becoming smaller in the direction toward the dielectric layer 106. In addition, the remained portion of the second electrode material 526 having a substantial uniform impurity concentration forms the second electrode portion 110 having the substantial constant width H2. In one embodiment, the second electrode layer 104 has the lowest dopant concentration in a portion adjoined with the dielectric layer 106, and thus has the smallest interface width.

Embodiments are not limited to the etching process having selectivity to the materials of different P-type dopant concentration. Other materials (such as N-type dopant) and etching methods (such as wet etching, dry etching, etc.) may be used to form the second electrode layer 104 having the profile of various widths according to device designs properly.

In other embodiments, the pattern of the second electrode layer 104 may be defined directly by a litho-mask and an etching process having no selectivity substantially to the electrode material 522 (FIG. 5A). Therefore, the electrode material 522 is not limited to the characteristic of the various dopant concentrations, and may use a film of a single characteristic or multi-layer structure of other kinds.

In some embodiments, portions of the dielectric layer 106 not contact with the second electrode layer 104 may be further removed to form the separated dielectric layers 106 as shown in FIG. 5C. In other embodiments, the step illustrated in FIG. 5C may be omitted, and the structure as shown in FIG. 5B is used as the memory device. Compared to the structure shown in FIG. 5B, the memory device shown in FIG. 5C has a larger memory window since a carrier injection can be restricted in the decided area of the dielectric layer 106 during an erasing step and a programming step. In addition, since the dielectric layers 106 shown in FIG. 5C are separated from each other, an influence between neighboring memory cells during operation can be decreased. Therefore, a space between the memory cells can be designed to be small, and memory density can be increased.

Figure 6:
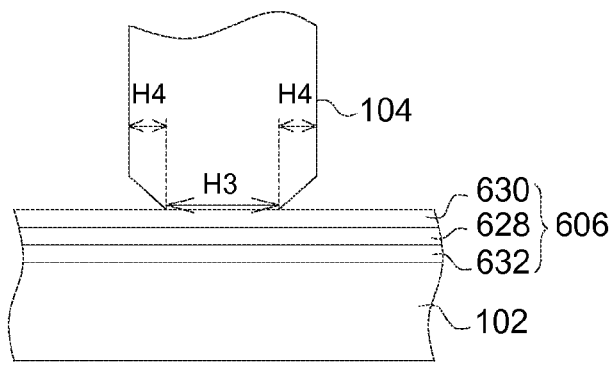
FIG. 6 illustrates a plan view of a semiconductor structure according to one embodiment.
Figure 7:
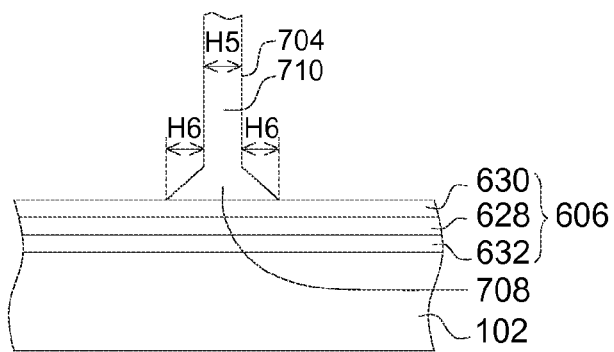
FIG. 7 illustrates a plan view of a semiconductor structure of a comparative example.
Figure 8:
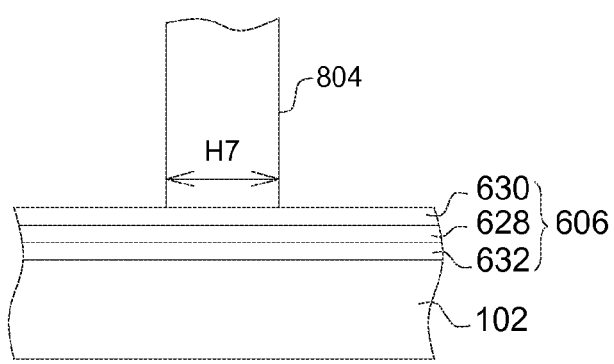
FIG. 8 illustrates a plan view of a semiconductor structure of a comparative example.

FIG. 6 illustrates a plan view of the semiconductor structure according to one embodiment. In this case, the dielectric layer 606 has an ONO structure. A nitride layer 628 as a charge-trapping layer is between an oxide layer 630 and an oxide layer 632, and the first electrode layer 102 and the second electrode layer 104 are polysilicon materials, so as to form a SONOS charge-trapping flash memory structure. In analytic experiments, a width H3 of a portion of the second electrode layer 104 adjoined with the dielectric layer 606 is 30 nm, and widths H4 of portions of the second electrode layer 104 not adjoined with the dielectric layer 606 are 10 nm. FIG. 7 and FIG. 8 illustrate plan views of the semiconductor structures of a first comparative example and a second comparative example, respectively. The structure in FIG. 7 is different from the structure in FIG. 6 in that the second electrode layer 704 has the first electrode portion 708 of various widths, wherein a width of the first electrode portion 708 becomes smaller in the direction away from the dielectric layer 606. In the analytic experiment, a width H5 of the second electrode portion 710 and widths H6 of portions of the first electrode portion 708 beyond sidewalls of the second electrode portion 710 are all 10 nm. The structure of FIG. 8 has the second electrode layer 804 of the constant width H7 which is 30 nm in the analytic experiment.

Figure 9:
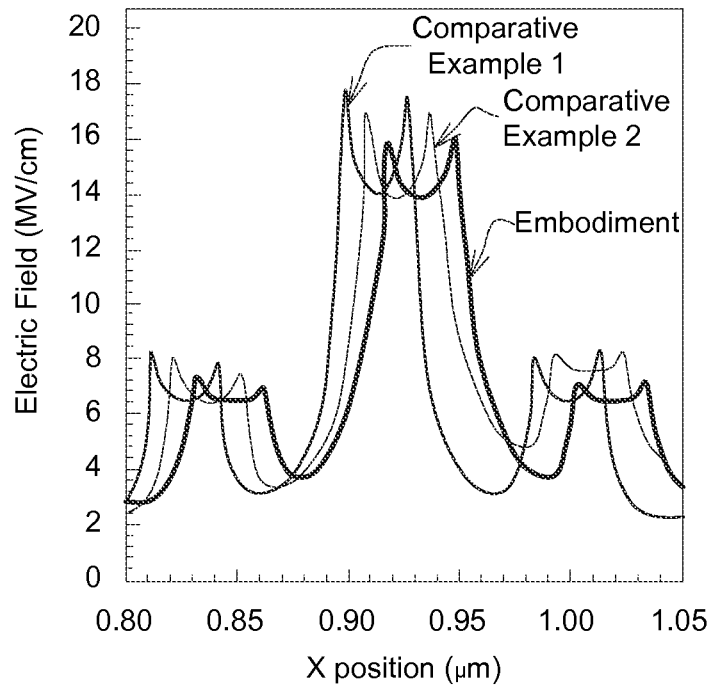
FIG. 9 shows electrical analysis curves of semiconductor structures.
Figure 10:
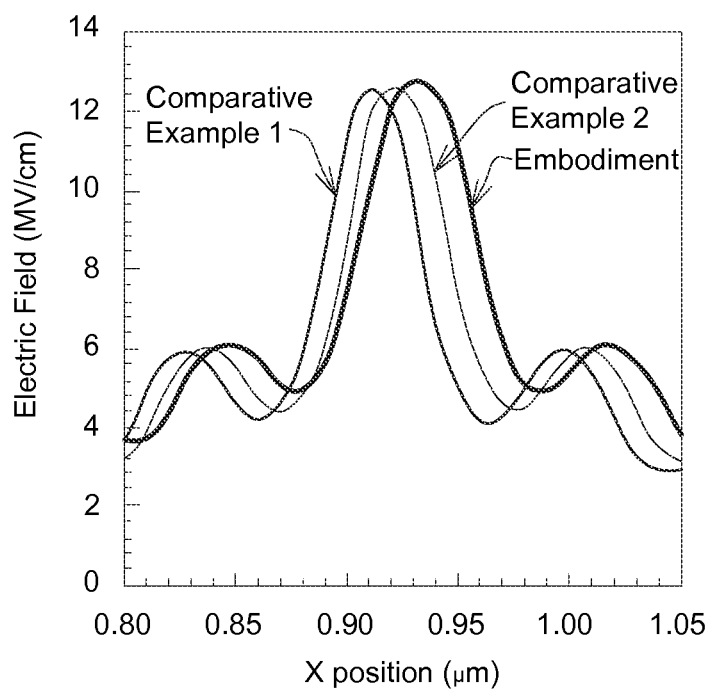
FIG. 10 shows electrical analysis curves of semiconductor structures.
Figure 11:
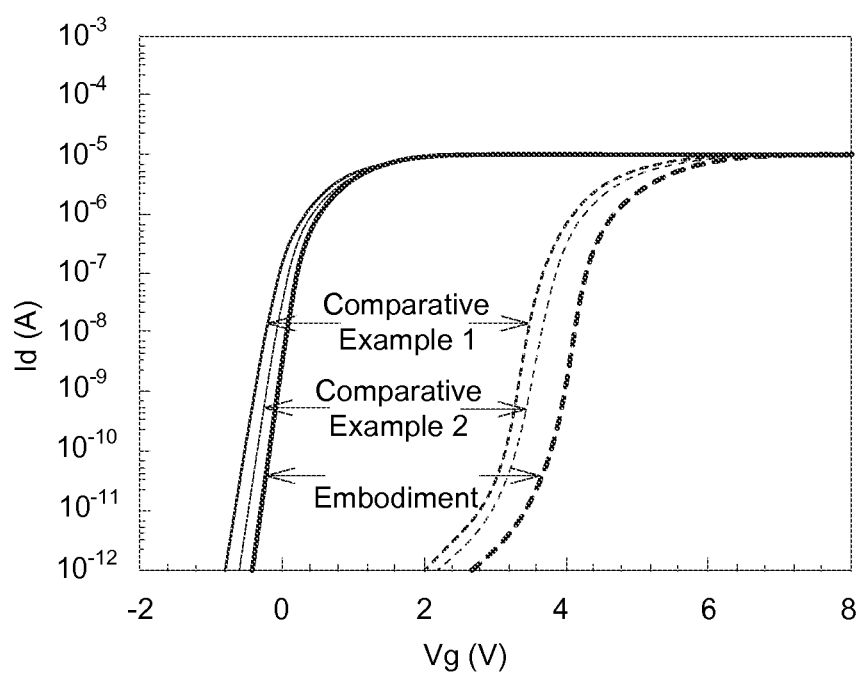
FIG. 11 shows electrical analysis curves of semiconductor structures.

FIG. 9 to FIG. 11 show electrical analysis curves of the semiconductor structures shown in FIG. 6 to FIG. 8. FIG. 9 illustrates electric field distributions of the oxide layers 630 at a fixed Y position and different X positions of the semiconductor structures under a condition of a Vpass of 10V and a Vprg of 20V. FIG. 10 illustrates electric field distributions of the oxide layers 632 away from the second electrode layers 104, 704, 804 at a fixed Y position and different X positions. Solid lines in FIG. 11 indicate electrical curves of the memories after an erasing step, and dotted lines indicate electrical curves of the memories after a programming step of 20V for 20 s. From results of FIG. 9 and FIG. 10, it can be found that, compared to the comparative examples, the oxide layer 630 of the embodiment adjacent to the second electrode layer 104 (word line) has a lower electric field, and the oxide layer 632 adjacent to the first electrode layer 102 (channel bit line) has a higher electric field, at the center and the edge sides. The electric field distribution characteristic of the embodiment can improve carrier injecting and trapping into the nitride layer 628 and inhibiting gate injection, during erasing and programming processes, and thus enlarge the memory window of the device, as shown in the result in FIG. 11.

The concepts of embodiments can be applied to NMOS and PMOS device properly.

While the invention has been described by way of example and in terms of the exemplary embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:
a first electrode layer;
a second electrode layer;
a dielectric layer having an ONO structure and disposed between the first electrode layer and the second electrode layer, wherein a width of the second electrode layer becomes larger in a direction away from the dielectric layer;
wherein the memory device is a 3D stacked memory device comprising a plurality of stack structures each of which comprises at least one of the first electrode layer and the second electrode layer is disposed between the stack structures and on opposing sides of the first electrode layers disposed in two adjacent stack structures; and
wherein the dielectric layer conformally covers on one of the stack structures and is disposed on opposing walls of the first electrode layer.

2. The memory device according to claim 1, wherein the second electrode layer comprises a first electrode portion and a second electrode portion, the first electrode portion is between the second electrode portion and the dielectric layer, materials of the first electrode portion and the second electrode portion have different characteristics.

3. The memory device according to claim 2, wherein a dopant concentration of the first electrode portion is lower than a dopant concentration of the second electrode portion.

4. The memory device according to claim 2, wherein a dopant concentration of the first electrode portion becomes lower in a direction toward the dielectric layer.

5. The memory device according to claim 1, wherein the second electrode layer comprises a first electrode portion and a second electrode portion, the first electrode portion is between the second electrode portion and the dielectric layer, the second electrode portion has a fixed width.

6. The memory device according to claim 1, wherein the second electrode layer comprises a first electrode portion adjoined with the dielectric layer, a width of the first electrode portion becomes larger in the direction away from the dielectric layer.

7. The memory device according to claim 1, wherein the second electrode layer has a first sidewall adjoined with the dielectric layer, and a flat second sidewall adjoined with the first sidewall and separated from the dielectric layer.

8. The memory device according to claim 1, wherein the second electrode layer has a first sidewall adjoined with the dielectric layer, and a concave second sidewall adjoined with the first sidewall and separated from the dielectric layer.

9. The memory device according to claim 1, wherein the second electrode layer has a first sidewall adjoined with the dielectric layer, and a convex second sidewall adjoined with the first sidewall and separated from the dielectric layer.

10. The memory device according to claim 1, wherein the second electrode layer has a first sidewall adjoined with the dielectric layer, and a second sidewall adjoined with the first sidewall and separated from the dielectric layer, an included angle between the first sidewall and the second sidewall is bigger than 90 degrees.

\* \* \* \* \*